(12) United States Patent
Singh

(10) Patent No.: US 10,594,135 B2
(45) Date of Patent: Mar. 17, 2020

(54) COMPACT, HIGH PERFORMANCE, AND ROBUST RC TRIGGERED ESD CLAMP

(71) Applicant: Dialog Semiconductor (UK) Limited, London (GB)

(72) Inventor: Gaurav Singh, Swindon (GB)

(73) Assignee: Dialog Semiconductor (UK) Limited, London (GB)

( * ) Notice: Subject to any disclaimer, the term of this patent is extended or adjusted under 35 U.S.C. 154(b) by 307 days.

(21) Appl. No.: 15/637,114

(22) Filed: Jun. 29, 2017

(65) Prior Publication Data

US 2019/0006841 A1    Jan. 3, 2019

(51) Int. Cl.
| | |
|---|---|
| *H02H 9/00* | (2006.01) |
| *H02H 9/04* | (2006.01) |
| *H02H 9/02* | (2006.01) |
| *H01L 27/02* | (2006.01) |

(52) U.S. Cl.
CPC ......... *H02H 9/046* (2013.01); *H01L 27/0285* (2013.01); *H02H 9/02* (2013.01)

(58) Field of Classification Search
None
See application file for complete search history.

(56) References Cited

U.S. PATENT DOCUMENTS

| | | | |
|---|---|---|---|
| 6,965,503 B2 | 11/2005 | Connor et al. | |
| 7,808,754 B2 * | 10/2010 | Jang | H02H 9/046 361/111 |
| 2006/0103998 A1 * | 5/2006 | Smith | H01L 27/0285 361/91.1 |
| 2007/0109697 A1 | 5/2007 | Huh | |
| 2010/0296212 A1 | 11/2010 | Liang et al. | |

OTHER PUBLICATIONS

"Boosted and Distributed Rail Clamp Networks for ESD Protection in Advanced CMOS Technologies," by Michael Stockinger et al., Electrical Overstress/Electrostatic Discharge Symposium, 2003, EOS/ESD '03. Sep. 21-25, 2003, 10pgs.
"A MOSFET Power Supply Clamp with Feedback Enhanced Triggering for ESD Protection in Advanced CMOS Technologies," by Jeremy C. Smith et al., Electrical Overstress/Electrostatic Discharge Symposium, 2003, EOS/ESD '03, Sep. 21-25, 2003, 9 pgs.

* cited by examiner

*Primary Examiner* — Stephen W Jackson
(74) *Attorney, Agent, or Firm* — Saile Ackerman LLC; Stephen B. Ackerman

(57) ABSTRACT

An object of the disclosure is to provide a compact RC triggered ESD clamp, which is used for fast ramp supplies, and is immune to parasitics, process, temperature variations, and a noisy environment. A further object of the disclosure is to provide an ESD clamp circuit with low power consumption, and which is robust against reliability or burnout failures. A further object of the disclosure is that the short time constant and the long time constant are realized using a single capacitor, charged by two separate resistors. Still further, another object of the disclosure is that the elements are connected in such a way that there are no additional active junctions connected to the charging node of the ESD clamp.

26 Claims, 8 Drawing Sheets

COMPACT, HIGH PERFORMANCE, AND ROBUST RC TRIGGERED ESD CLAMP

BACKGROUND

Field

The disclosure relates generally to RC triggered ESD clamps.

Description

Early circuits use large RC time constants to keep an electrostatic discharge (ESD) clamp turned ON, for the duration of an ESD event. These circuits suffer from poor filtering characteristics, and consume large current if a fast transient occurs at a supply rail, and these circuits can't be used if fast ramp rates are required for the supply voltages. For such cases a disable circuit is required, which disables the ESD clamp when the chip is powered up. This is not allowed in all applications, for example USB, or automotive etc.

FIG. 1 illustrates boosted and distributed rail clamp networks 100, for ESD protection in advanced CMOS technologies, of the prior art. The rail clamp networks include a slew rate detector, an on-time control circuit, and RC time constant of 21 ns.

FIG. 2 shows MOSFET power supply clamp 200, with feedback enhanced triggering for ESD protection in advanced CMOS Technologies, of the prior art. The MOSFET power supply clamp includes PMOS and NMOS inverters and feedback, and a PMOS capacitance and an NMOS resistance.

FIG. 3 shows compact, timed-shutoff, MOSFET-based power clamp 300, for on-chip ESD protection, of the prior art. The MOSFET-based power clamp includes three inverters each comprising a PMOS and NMOS device, PMOS feedback, and a capacitor and resistor.

FIG. 4 shows low leakage low cost-PMOS based power supply clamp 400, with active feedback for ESD protection in 65 nm CMOS Technologies, of the prior art. The PMOS based power supply clamp includes three inverters each comprising a PMOS and NMOS device, PMOS feedback, and a PMOS capacitance and an NMOS resistance.

These circuits, using static and dynamic feedback techniques, have good filtering characteristics. The latch-like circuits rely on weak currents to charge a parasitic capacitance, to produce a large turn-ON time, required for the clamp to discharge the whole ESD charge. These weak currents are not modeled well, and the currents are overpowered by the leakages introduced by the devices connected to these nodes, especially at higher temperatures. The duration for which the clamp remains turned-ON varies significantly across corners. For the case of parasitic effects, like high rail resistance, there can be an infinite ON time or "sticking". So the circuits of FIG. 1, FIG. 2, FIG. 3, and FIG. 4 are difficult to predict and design reliably.

FIG. 5 illustrates design and characterization of multi-RC-triggered MOSFET-based power clamp 500, for on-chip ESD protection, of the prior art. This type of circuit employs multiple RC domino type circuits R1C1, R2C2, and R3C3, to generate effective long time constants, to avoid impact of leakages and balanced weak currents as in the case of feedback based circuits. But these circuits do not have great filtering characteristics which allow sub microsecond supply ramp times, are complex to design, and are not as compact in area as compared to feedback based circuits.

SUMMARY

An object of the disclosure is to provide a compact RC triggered ESD clamp circuit, which can be used for fast ramp supplies, and is immune to parasitics, process, temperature variations, and a noisy environment.

A further object of the disclosure is to provide an ESD clamp circuit with low power consumption, and which is robust against reliability or burnout failures.

A further object of the disclosure is that a short time constant and a long time constant are realized using a single capacitor, charged by two separate resistors.

Still further, another object of the disclosure is that the elements are connected in such a way that there are no additional active junctions connected to the charging node of the ESD clamp.

To accomplish the above and other objects, a compact RC triggered ESD clamp circuit is disclosed, comprising a first and a second resistance, further comprising a first and a second gate controlled transistor, where the first resistance is configured to have a lower resistance than the second resistance. The RC triggered ESD clamp further comprises a capacitor, where the first and second resistances are configured to charge the capacitor at a charging node. The RC triggered ESD clamp still further comprises a first, a second, a third, and a fourth inverter, and a large FET device, configured to provide a dynamic feedback trigger signal for the ESD clamp circuit, where the second, third, and fourth inverters are connected in series between the capacitor and the large FET device, and the first resistance is configured to be controlled by the dynamic feedback trigger signal, and the second resistance is configured to be controlled by the dynamic feedback signal through the first inverter.

The above and other objects are further achieved by a method for a compact RC triggered ESD clamp. The steps include providing an RC triggered ESD clamp, using a dynamic feedback trigger signal. The steps also include charging a capacitor with a first resistance and a second resistance at a charging node, wherein the second resistance is higher than the first resistance. The steps also include using the dynamic feedback trigger signal to charge the capacitor with the first resistance when the ESD clamp is off. The steps also include using the dynamic feedback trigger signal to charge the capacitor with the second resistance when the ESD clamp is on.

In various embodiments the trigger circuit may be used to trigger any type of voltage or current activated ESD clamp device, and comprises a Metal-Oxide-Semiconductor Field-Effect Transistor (MOSFET), a Bipolar Junction Transistor (BJT), a Silicon Controlled Rectifier (SCR), or a Diode for Alternating Current (DIAC).

In various embodiments the RC triggered ESD clamp may be achieved using a capacitance multiplier circuit, to increase the effective capacitance.

In various embodiments the RC triggered ESD clamp may be achieved using a capacitance added between the supply (VDD) and the gate of a large FET device, to optimize the speed of the circuit.

In various embodiments the RC triggered ESD clamp may be achieved using a series combination of passive resistors with PMOS, to implement the resistors of the RC time constant.

In various embodiments the RC triggered ESD clamp may be achieved using simple circuits, such as a Schmitt trigger circuit or a series diode device, to modify the triggering of the inverting stage.

In various embodiments the RC triggered ESD clamp may be used in various rail strategies, such as a central clamp strategy, a distributed clamp strategy, or a boosted rail clamp strategy, as equally effective and advantageous.

DETAILED DESCRIPTION

The primary technical objective to be achieved by the present disclosure is a compact RC triggered ESD clamp, which can be used for fast ramp supply capabilities, immune to parasitic, process, temperature variations, and a noisy environment.

In the RC triggered ESD clamp of the disclosure, dynamic feedback is achieved from a triggering signal, using PMOS transistors as the resistors of the RC time constant. Both short and long RC time constants are realized using a single capacitor charged by two separate resistors. The elements are connected in such a way that there are no additional active junctions connected to the charging node of the capacitor. Any noise is filtered when the ESD clamp is off, for the short RC time constant, and the charge is fully discharged when the ESD clamp is on, for the long RC time constant.

The clamp of the disclosure comprises two parts, one large clamp device which conducts the ESD current, and a trigger circuit which controls the control terminal of the clamp device, the gate of the MOSFET device. Early circuits of the prior art used a single RC time constant based trigger circuit, and required much area to realize a time constant >1 us using the devices. Also the prior art suffered from poor filtering characteristics, and triggered during the supply ramp or a noise spike on the supply.

Some prior art circuits used two RC time constant circuits, where a small time constant was used to detect the ESD event using a first RC circuit, and a second RC circuit was used to turn the clamp OFF for a longer duration >1 us. In these circuits, a very weak current charged a parasitic capacitance, to implement the second time constant, and there were other active device junctions connected to the node, resulting in leakage. Hence the charging time of the parasitic capacitance node sometimes had an infinite ON time, or a "sticking" type of situation.

Figure 1:
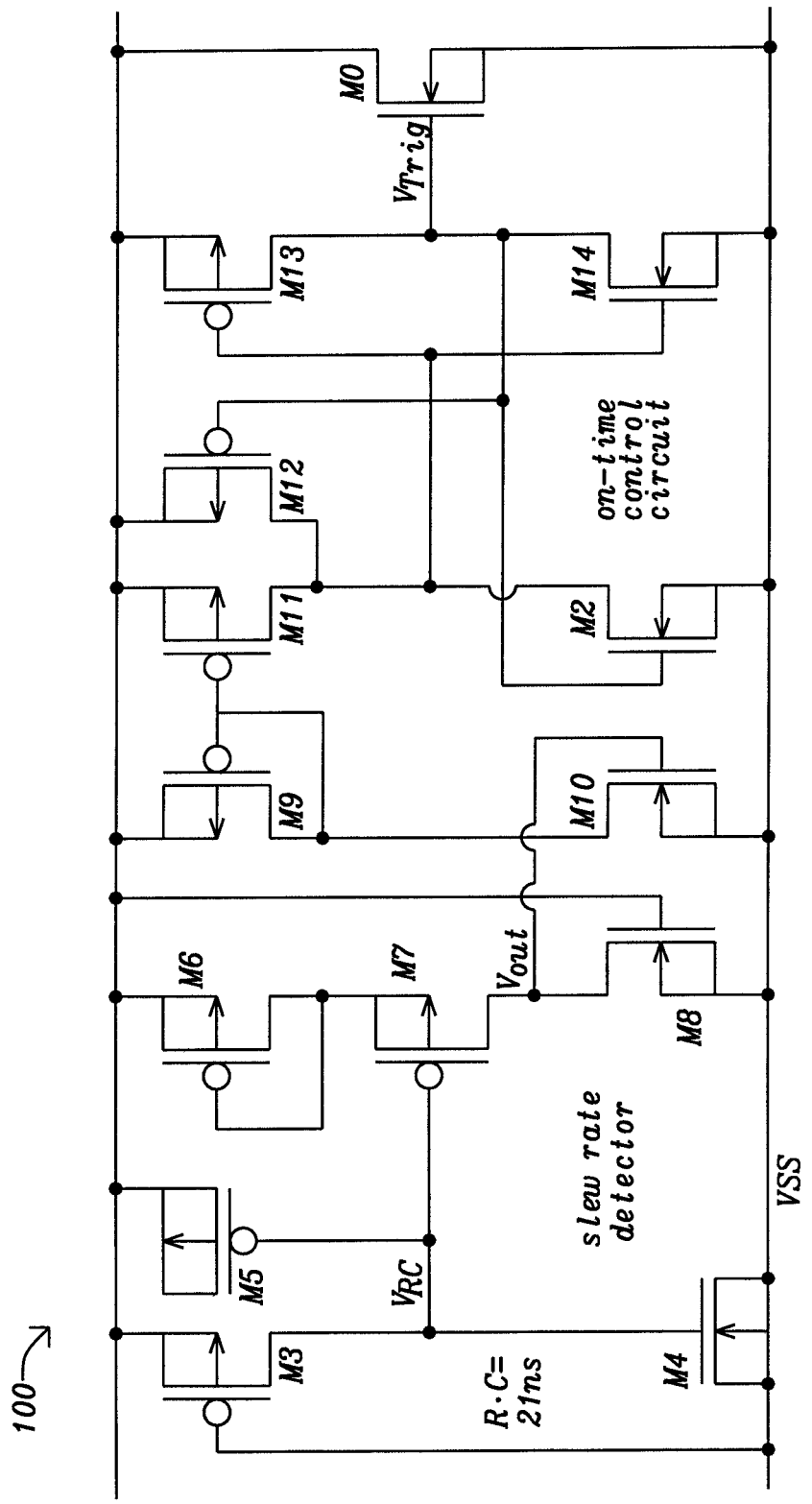
FIG. 1 illustrates boosted and distributed rail clamp networks, for ESD protection in advanced CMOS technologies, of the prior art.
Figure 2:
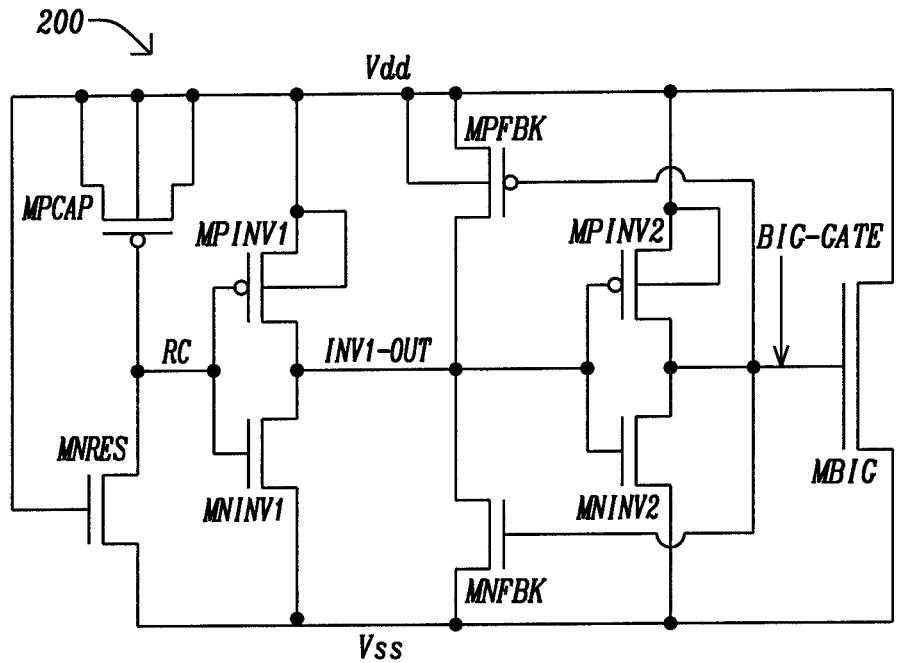
FIG. 2 shows a MOSFET power supply clamp with feedback enhanced triggering, for ESD protection in advanced CMOS Technologies, of the prior art.
Figure 3:
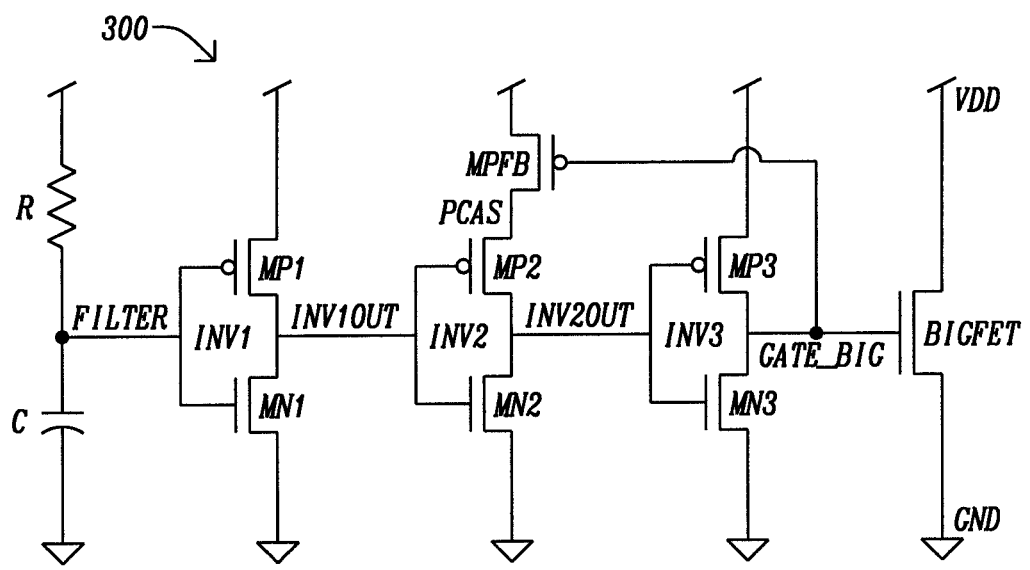
FIG. 3 shows a compact, timed-shutoff, MOSFET-based power clamp, for on-chip ESD protection, of the prior art.
Figure 4:
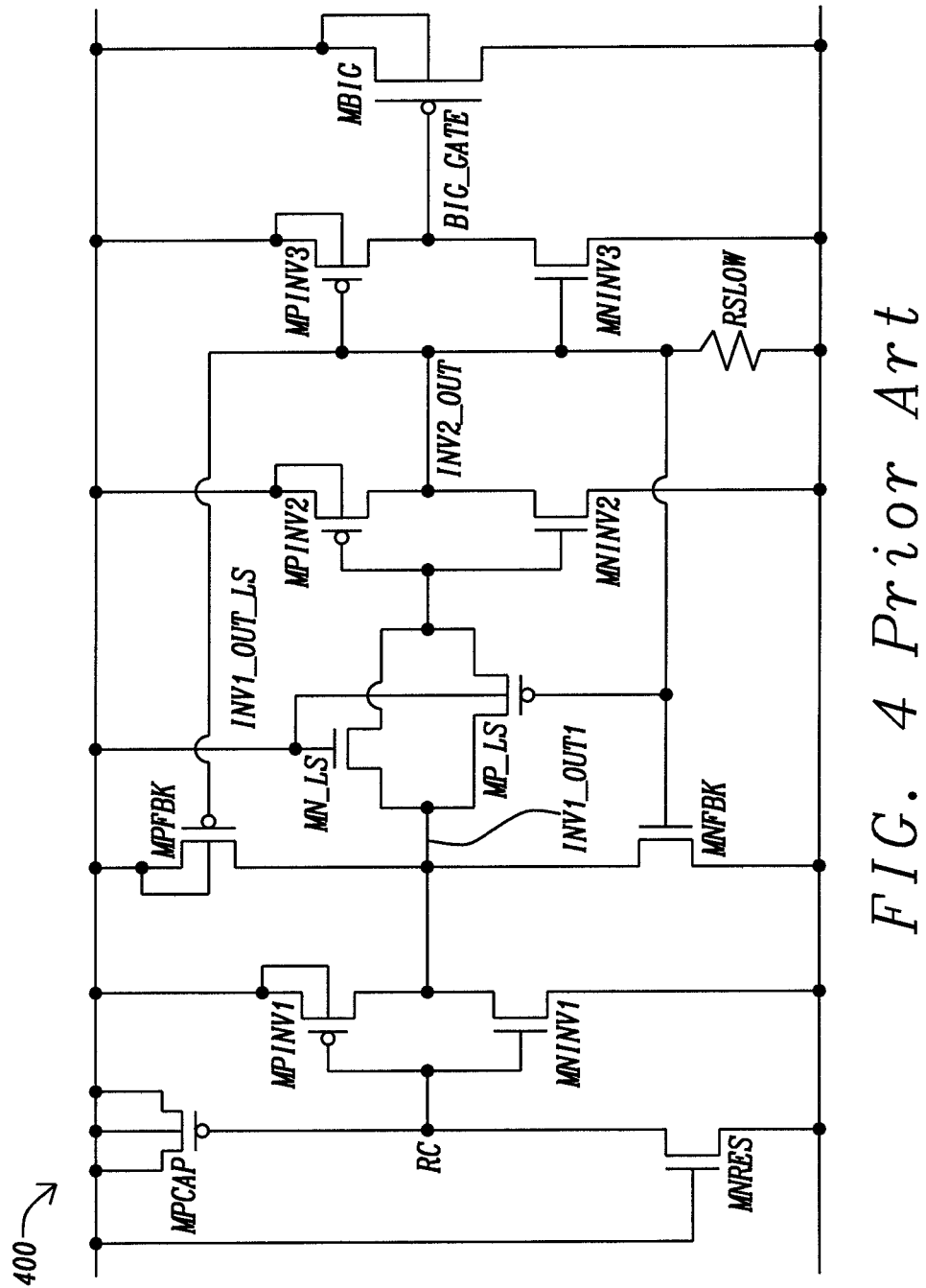
FIG. 4 shows a low leakage low cost-PMOS based power supply clamp, with active feedback for ESD protection in 65 nm CMOS Technologies, of the prior art.
Figure 5:
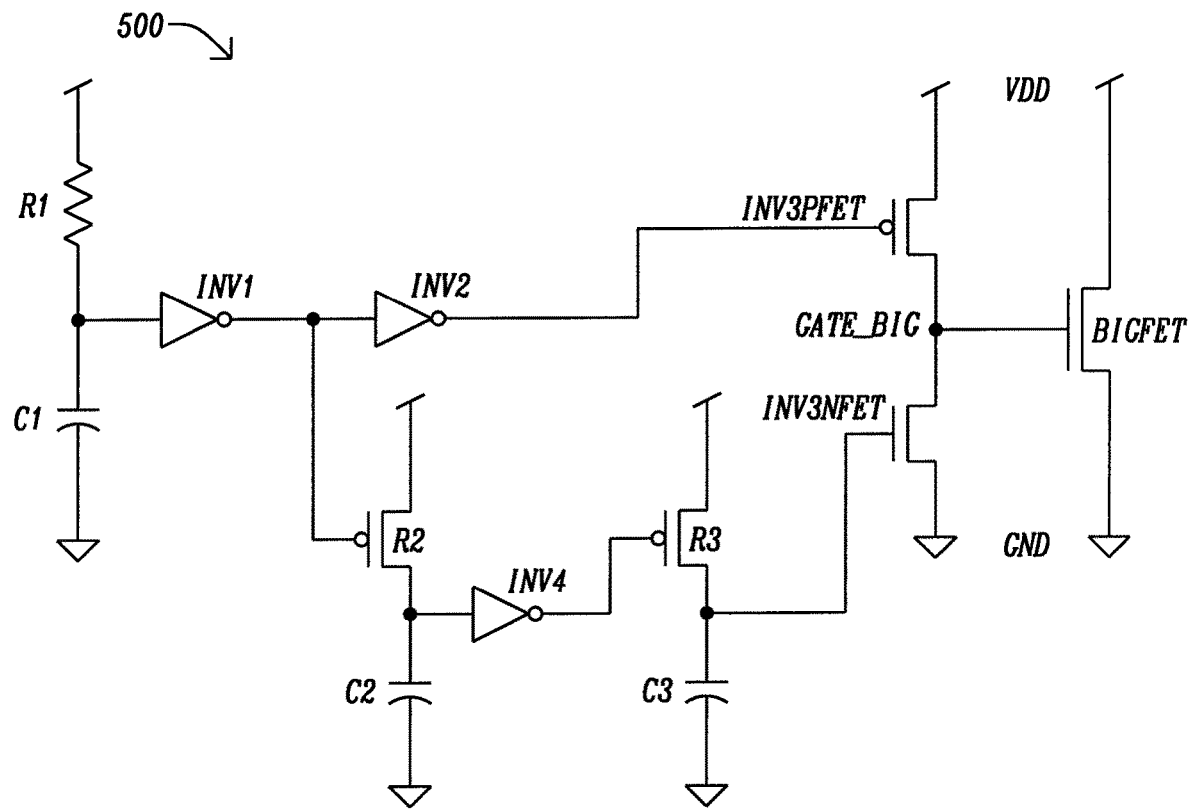
FIG. 5 illustrates design and characterization of a multi-RC-triggered MOSFET-based power clamp, for on-chip ESD protection, of the prior art.
Figure 6:
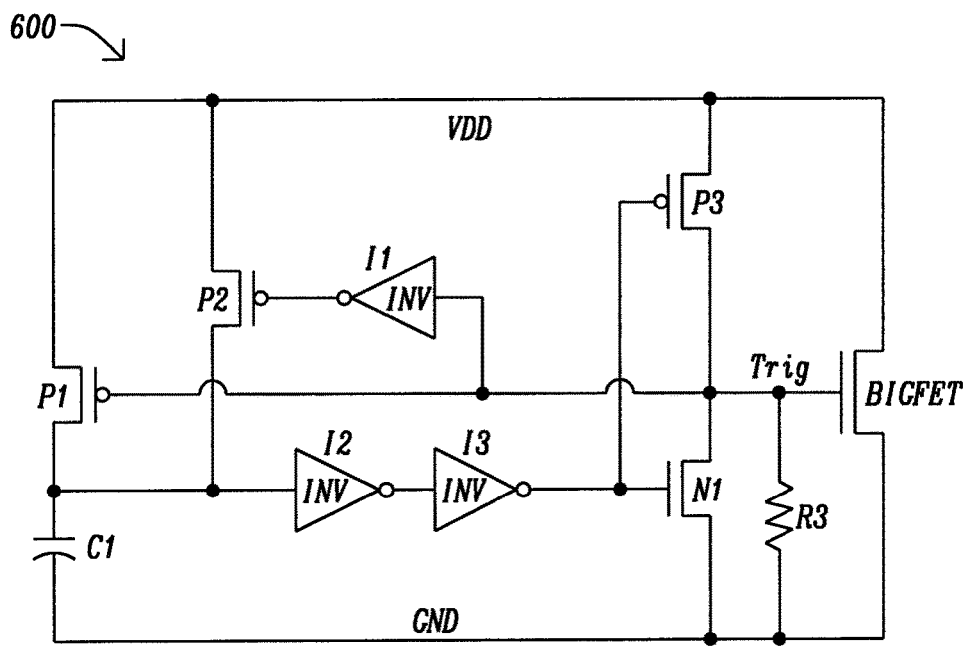
FIG. 6 shows a simple and new implementation of an RC triggered ESD clamp, circuit embodying the principles of the disclosure.

FIG. 6 shows 600, a simple and new implementation of an RC triggered ESD clamp circuit. The circuit comprises one small capacitor C1 charged by two different resistors implemented using gate controlled PMOS transistors P1 and P2. They are sized such that the resistance of P1=R1 is much less than the resistance of P2=R2. Sizing ensures that R1C1 is about 30-50 ns, and R2C1 is about 500 ns. Although it can vary for different technologies, depending upon the components and their properties, capacitance C1 has a preferred value between about 20 fF and 100 fF.

The inverter comprising device P3 and device N1 generates the "Trig" signal, which controls the gate of the large clamp device BigFET. The same signal also connects to the gate of device P1, providing dynamic feedback. The gate of P2 is connected to the inverted version of the "Trig" signal, through inverter I1. As a result, when the ESD clamp is OFF the effective time constant R1C1 is very small, and the clamp filters any noise spikes or fast ramp rates at supply rail VDD. During an ESD event when the ESD clamp turns ON, P1 is OFF and P2 is ON. The effective time constant R2C1 is large, ensuring the whole charge is discharged during the ESD event. BigFET is a large device, designed to carry the entire ESD current. BigFET is activated by the clamp circuit during an ESD event, and can be implemented using a NMOS, PMOS, BJT, SCR, DIAC, or similar type device. The size of BigFET depends upon technology and the impedance of the manufactured device, and the total width of the transistor is in the 1000 to 5000 um range.

An important point of the disclosure is that large resistor R2 charges pure capacitances, C1 plus the gate capacitances of small inverter I2. There are no other active device junctions connected to the charging node of the capacitor, hence the leakage current at this node is negligible across all process and temperature corners. This feature makes the proposed RC triggered ESD clamp robust and reliable against different process and operating condition variations.

A unique feature of this circuit is that during applications where large spikes sometimes arrive at the supply rail, the clamp will false trigger in such an extreme case. Since the supply rail is HIGH, the PMOS resistors have large overdrive. Hence the effective resistance of P2 in such an event is very small, and the clamp returns to the OFF state in <500 ns, as compared to tens of microseconds in prior art circuits. This feature results in higher efficiency, lower power consumption, and robustness against reliability and burnout failures due to such events.

The proposed RC triggered ESD clamp also includes inverter I2, whose input is at the charging node of the capacitor, and the drains of transistors P1 and P2. Inverter I3 is across the output of inverter I2, and the gates of device P3 and device N1. The source of P3 is VDD, and the drain of P3 is the drain of N1, at signal "Trig". The "Trig" signal is across resistor R3 and GND, and the source of N1 is also GND. In the proposed ESD clamp, P3 is a PMOS device and N1 is an NMOS device, which further comprise a fourth inverter (P3:N1). Invertors I1, I2 and (P3:N1) perform buffering of the signal generated by the RC circuit, and are sized sufficiently to drive the gate of the BigFET at fast enough speeds.

Typical sizes of these devices are small as compared to BigFET, by a factor of approximately 100 to 1000. P1 and P2 are used as resistors forming respective time constants short (about 30-50 ns) and long (about 500 ns). Capacitance C1 is chosen, and determines the sizing of P1 and P2, depending upon the impedance of the devices for the respective technology. P3 and N1 form an invertor driving the gate of BigFET and are sized large enough to drive the gate capacitance. The circuit as compared to others, is fairly simple and compact in terms of chip area, requiring less and smaller devices.

Figure 7:
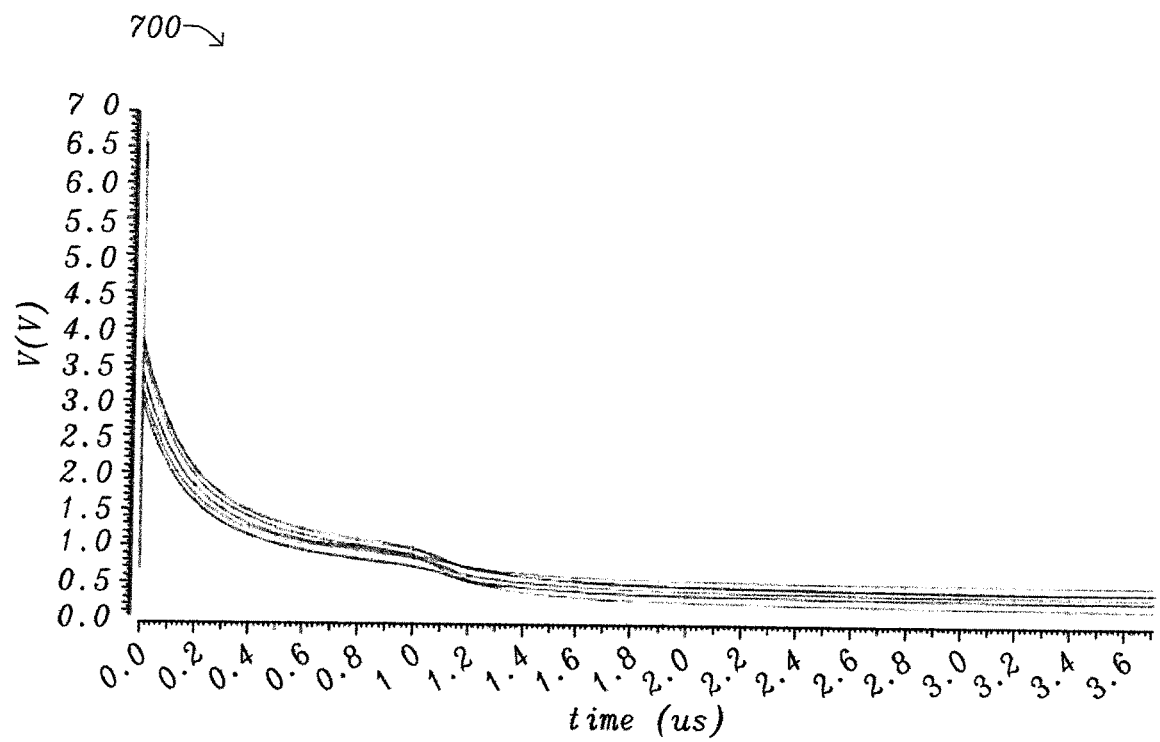
FIG. 7 shows a simulated response of the proposed RC triggered ESD clamp to a 2 KV Human Body Model (HBM) event across all process corners.

FIG. 7 shows 700, the simulated response of the proposed RC triggered ESD clamp to a 2 KV Human Body Model (HBM) event across all process corners. The HBM event simulates electrostatic discharge from a human being. It is evident from FIG. 7 that the ESD clamp of the disclosure remains ON for the whole duration of the HBM event, allowing full discharge with the long RC time constant, and clamping the voltage effectively below 4V.

Figure 8:
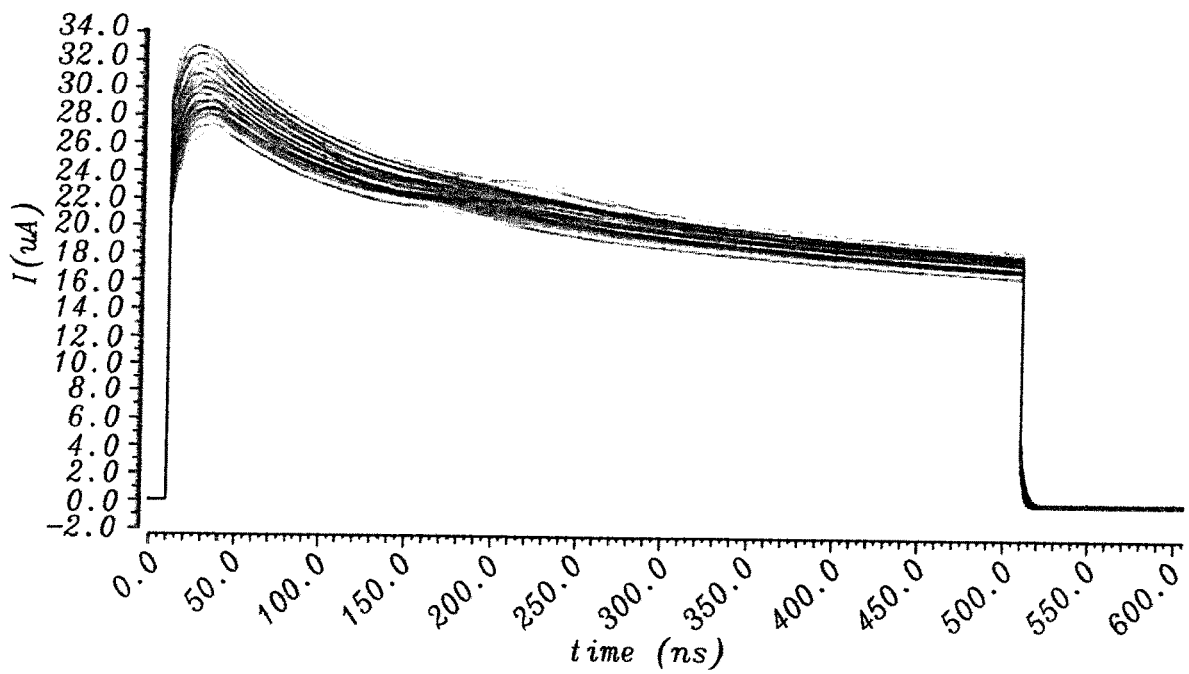
FIG. 8 illustrates the simulated response of the proposed RC triggered ESD clamp to a fast supply ramp of 15 V/us across all process and temperature corners.

FIG. 8 illustrates 800, the simulated response of the proposed RC triggered ESD clamp to a fast supply ramp of 15V/us across all process and temperature corners. The clamp does not trigger falsely, since the effective time constant is very small. And the current consumed by the circuit is below 35 uA at such fast ramps.

Figure 9:
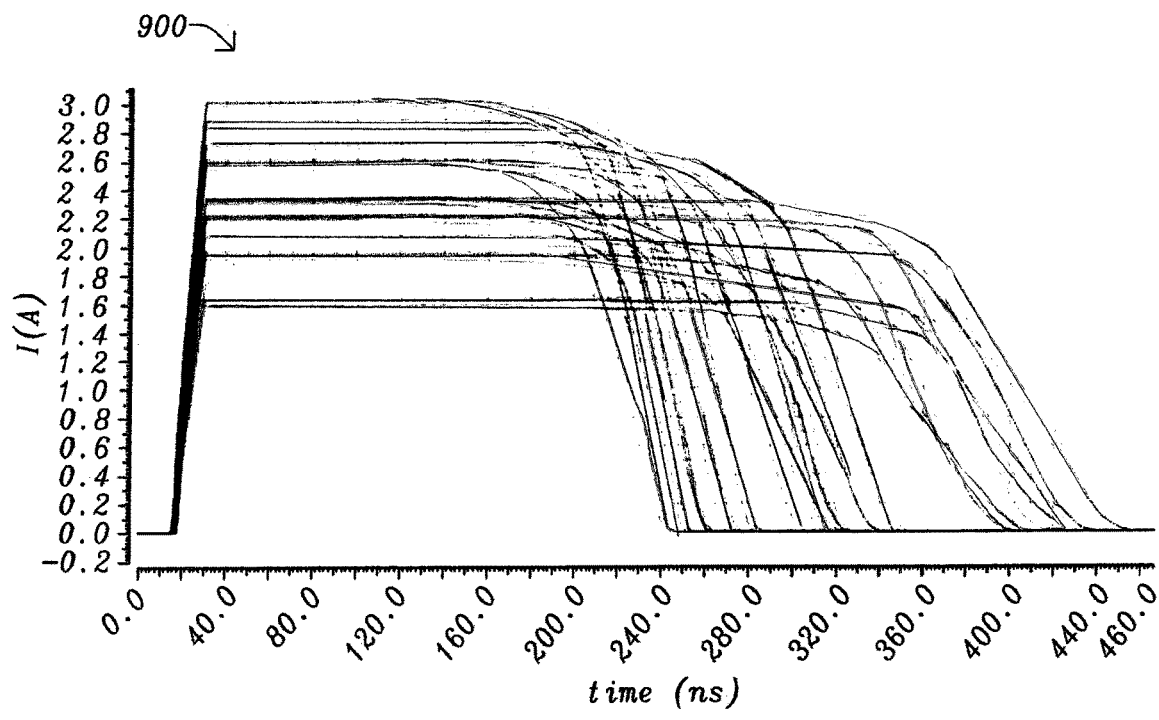
FIG. 9 shows the simulated response of the proposed RC triggered ESD clamp to a forced trigger event of slope 150 V/us across all process and temperature corners, where the rail resistance used is 0 Ohms.

FIG. 9 shows 900, the simulated response of the proposed RC triggered ESD clamp to a forced trigger event of slope 150 V/us across all process and temperature corners, where the rail resistance used is 0 Ohms. The clamp triggers for such a fast event, and switches OFF completely by 450 ns, since the effective resistance R2 is very small. Hence the conduction duration of the clamp in the case of a mis-trigger is very small. This value can be tens of microseconds for prior art types of clamps.

Figure 10:
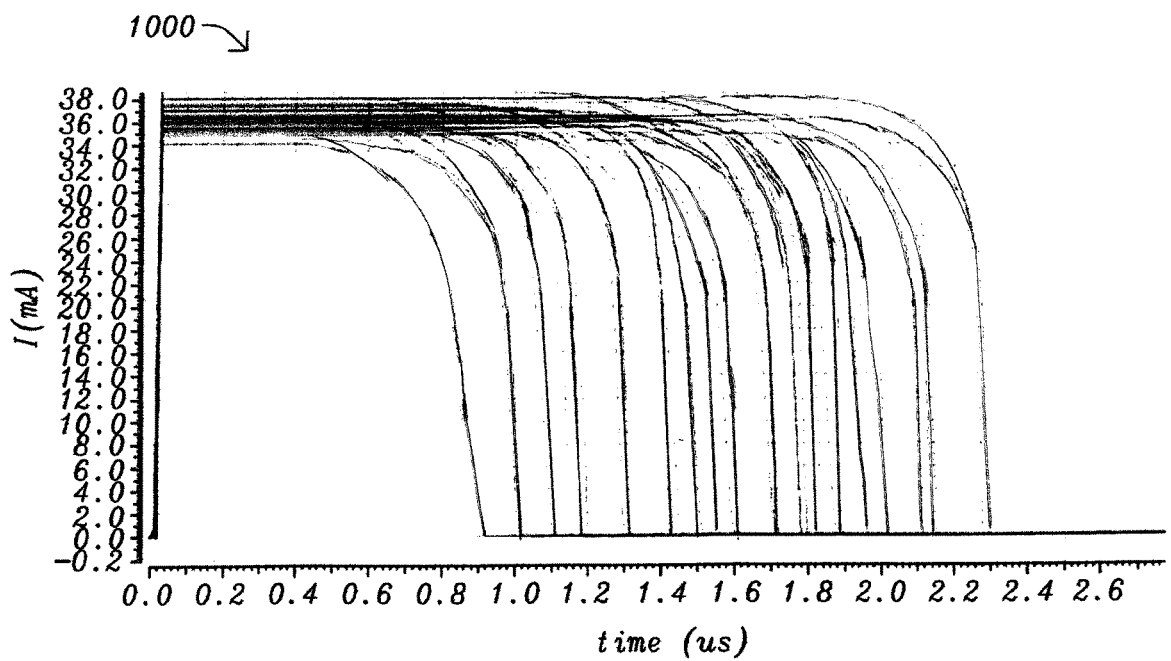
FIG. 10 shows the simulated response of the proposed RC triggered ESD clamp to a forced trigger event of slope 150 V/us across all process and temperature corners, where the rail resistance used is 100 Ohms.

FIG. 10 shows 1000, the simulated response of the proposed RC triggered ESD clamp to a forced trigger event of slope 150 V/us across all process and temperature corners, where the rail resistance used is 100 Ohms. The clamp triggers for such a fast event but it switches OFF completely by 2.3 us. This shows that the circuit doesn't suffer from an infinite ON time, or a "sticking" type of situation, even for extreme rail resistances as high as 100 Ohms. This kind of problem is observed in prior art feedback circuits, which may result in functional, reliability, and burnout failures.

The trigger circuit of the proposed ESD clamp may be used to trigger any type of voltage or current activated ESD clamp device, such as a Metal-Oxide-Semiconductor Field-Effect Transistor (MOSFET), a Bipolar Junction Transistor (BJT), a Silicon Controlled Rectifier (SCR), and a Diode for Alternating Current (DIAC).

Figure 11A:
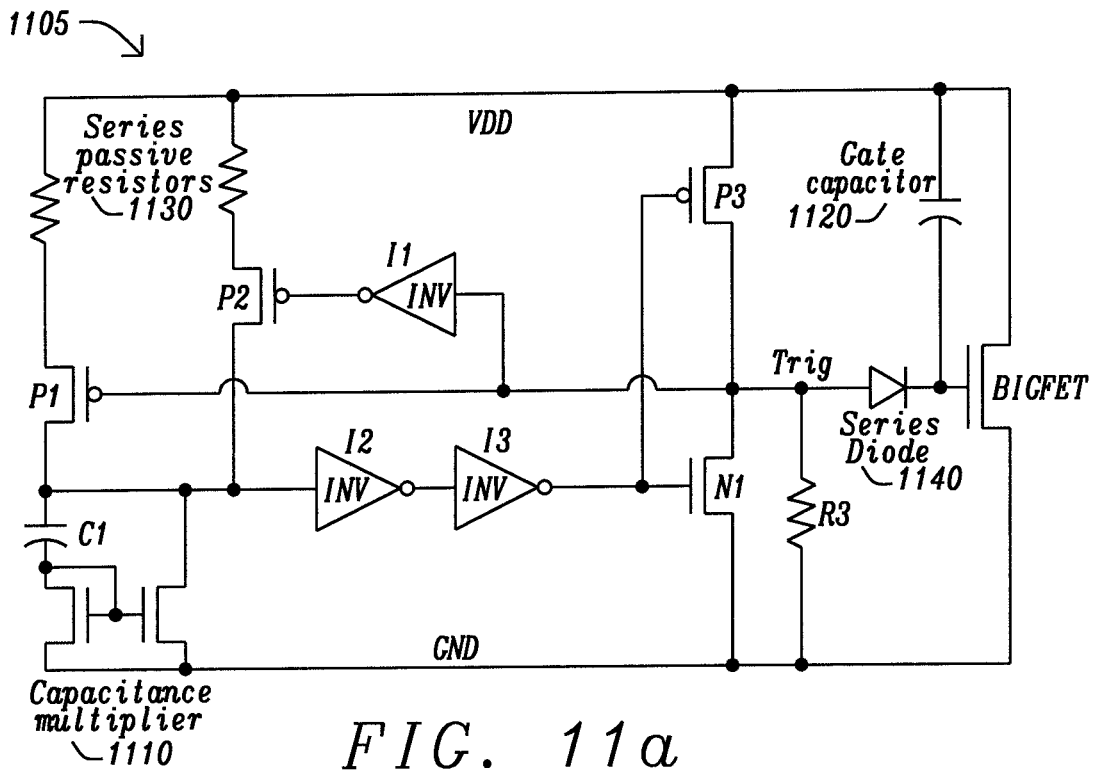
FIG. 11a gives an example how the proposed ESD clamp may be achieved using a capacitance multiplier circuit in place of inverters I2/I3, instead of a small capacitor charged by two different resistors, to increase the effective capacitance.

FIG. 11a gives 1105, how the proposed ESD clamp may be achieved using a capacitance multiplier circuit 1110, instead of a small capacitor charged by two different resistors, to increase the effective capacitance. The purpose of the capacitance multiplier circuit would be to optimize the turn ON speed of the clamp. The clamp may also be achieved using a capacitance 1120, added between the supply (VDD) and the gate of a large FET device to optimize the speed of the circuit, or a series combination of passive resistors 1130 to implement the resistors of the RC time constant. The purpose of the series combination of passive resistors would be to optimize area by using explicit resistors based on the technology. In addition, the ESD clamp may be achieved using simple circuits to modify the triggering of the inverting stage, such as by a Schmitt trigger circuit in place of inverters I2/I3. The purpose of the Schmitt trigger circuit would be to define the triggering point of the inverting stages depending upon the direction of state of the clamp. A series diode device 1140 may also be added at the BigFET input. The purpose of the series diode device would be to hold the gate charge of BigFET for a longer duration. And various rail strategies may be used, such as a central clamp strategy, a distributed clamp strategy, or a boosted rail clamp strategy, as equally effective and advantageous. Usage of the central clamp strategy and the distributed clamp strategy would depend upon the pad structure and rail definition of the product.

Figure 11B:
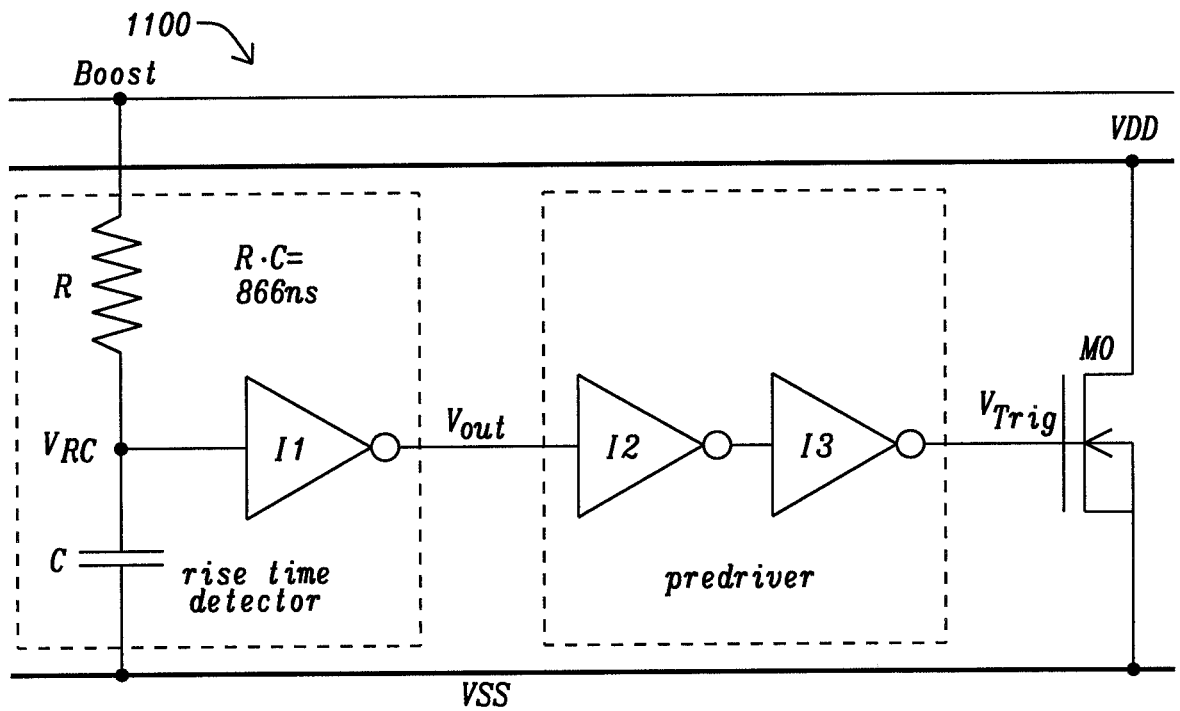
FIG. 11b gives an example of a Boosted Rail Clamp Strategy, that employs a variation of the proposed the RC triggered ESD clamp, where the large FET device has a different supply, known to the inventor.

FIG. 11b gives 1100, an example of a Boosted Rail Clamp Strategy, that employs a variation of the proposed RC triggered ESD clamp, where the large FET device has a different supply, known to the inventor. The circuit comprises capacitor C, charged by resistor R, sized such that the RC time constant is about 866 ns. Resistor R is connected across signal "Boost" and capacitor C, at the input of inverter I1, which together comprise the rise time detector. Signal "Vout", the output of the rise time detector, supplies the predriver circuit. The predriver circuit comprises inverter I2 and inverter I3, which supplies signal "VTrig" to the gate of device M0, a large FET device FET whose drain is VSS and source is VDD.

Figure 11C:
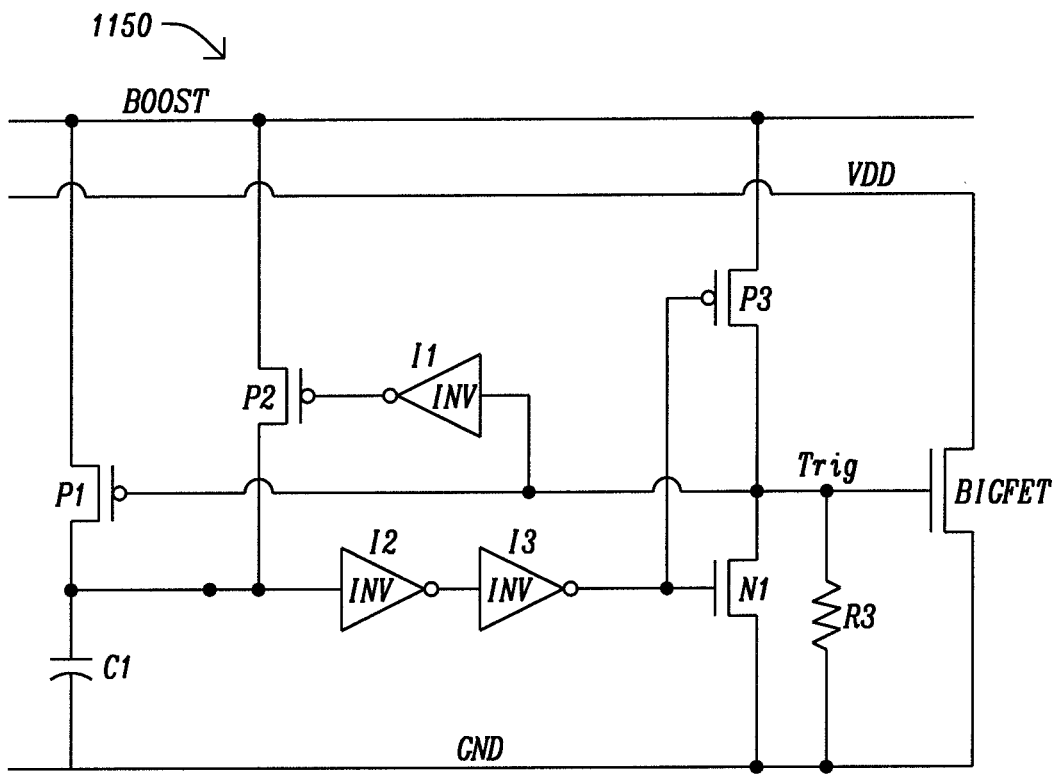
FIG. 11c gives an example of a Boosted Rail Clamp Strategy, that employs a variation of the proposed RC triggered ESD clamp, where devices P1, P2, and P3 are connected to a boosted rail instead of VDD.

FIG. 11c gives 1150, an example of a Boosted Rail Clamp Strategy, that employs a variation of the proposed RC triggered ESD clamp, where devices P1 and P2 are connected to a boosted rail instead of VDD. FIG. 11c is similar to FIG. 6, where the circuit comprises one small capacitor C1 charged by two different resistors implemented using gate controlled PMOS transistors P1 and P2. They are sized such that the resistance of P1=R1 is much less than the resistance of P2=R2. Note that all the inverters (including I1, I2, I3 and P3-N1) and devices P1 and P2 are powered by the Boost rail. Only the drain of BigFET is connected to the VDD rail.

Figure 12:
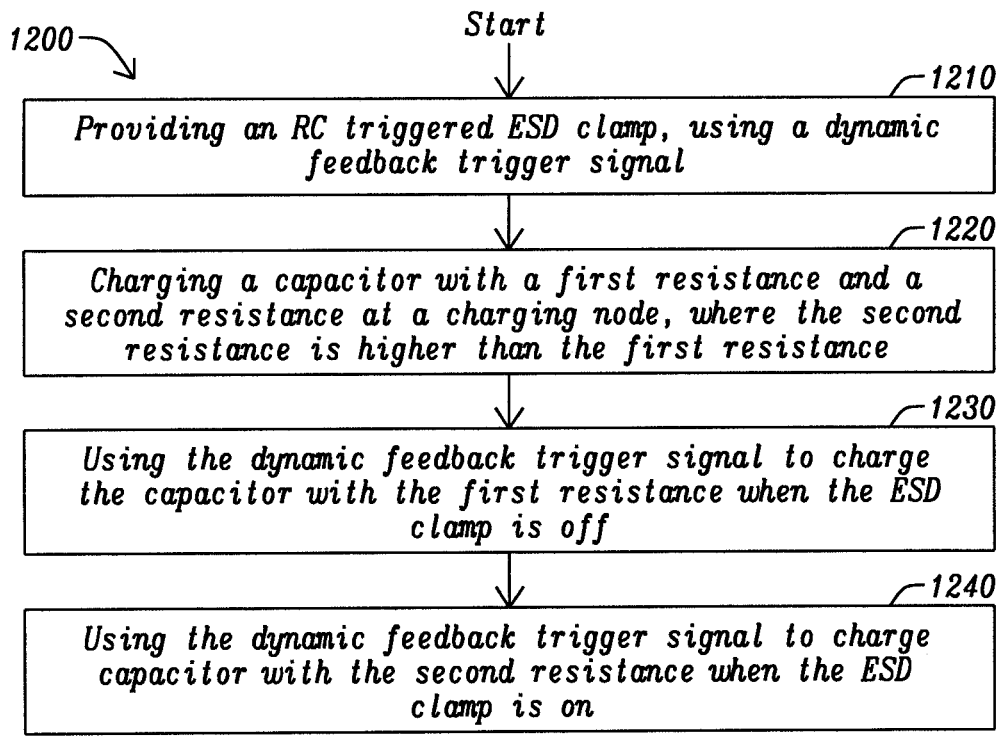
FIG. 12 is a flow chart of a method for a compact RC triggered ESD clamp.

FIG. 12 is flow chart 1200 of a method for a compact RC triggered ESD clamp. The steps include 1210, providing an RC triggered ESD clamp, using a dynamic feedback trigger signal. The steps also include 1220, charging a capacitor with a first resistance and a second resistance at a charging node, wherein the second resistance is higher than the first resistance. The steps also include 1230, using the dynamic feedback trigger signal to charge the capacitor with the first resistance when the ESD clamp is off. The steps also include 1240, using the dynamic feedback trigger signal to charge the capacitor with the second resistance when the ESD clamp is on.

The advantages of one or more embodiments of the present disclosure include the condition if the ESD clamp is forced to turn ON due to a large spike or noise from a switching application, then the ESD clamp turns OFF within 450 ns, unlike prior art clamps, which can take tens of microseconds to turn OFF. The compact RC triggered ESD clamp saves in power consumption and efficiency loss for such an application.

While this invention has been particularly shown and described with reference to the preferred embodiments thereof, it will be understood by those skilled in the art that various changes in form and details may be made without departing from the spirit and scope of the invention.

The invention claimed is:

1. An RC triggered ESD clamp circuit, comprising:
   a first and a second resistance, comprising:
      a first and a second gate controlled transistor, wherein said first resistance is configured to have a lower resistance value than said second resistance;
   a capacitor, wherein said first and said second resistances are configured to charge said capacitor at a charging node;
   a first, a second, a third, and a fourth inverter;
   a large FET device, configured to provide a dynamic feedback trigger signal for said ESD clamp circuit, wherein said dynamic feedback trigger signal is configured to charge said capacitor with said first resistance when said ESD clamp is off and to charge said capacitor with said second resistance when said ESD clamp is on;
      wherein said second, third, and fourth inverters are connected in series between said capacitor and said large FET device; and
      wherein said first resistance is configured to be controlled by said dynamic feedback trigger signal, and wherein said second resistance is configured to be controlled by said dynamic feedback signal through said first inverter.

2. The circuit of claim 1, wherein said first resistance and said capacitor are configured for a first RC time constant of about 30-50 ns.

3. The circuit of claim 1, wherein said second resistance is configured for a second RC time constant, longer than said first time constant, of about 500 ns.

4. The circuit of claim 2, wherein said RC triggered ESD clamp is configured to be OFF for said first RC time constant.

5. The circuit of claim 3, wherein said RC triggered ESD clamp is configured to be ON, for said second RC time constant.

6. The circuit of claim 1, wherein said first and said second gate controlled transistors are the only active device junctions connected to said capacitor.

7. The circuit of claim 1, wherein said first and second gate controlled transistors are PMOS devices.

8. The circuit of claim 1, wherein said first gate controlled transistor is connected to the gate of said large FET device.

9. The circuit of claim 1, wherein said second gate controlled transistor is connected to an output of said first inverter.

10. The circuit of claim 1, wherein said second inverter has its input connected at said charging node of said capacitor, and to the drains of said first and said second gate controlled transistors.

11. The circuit of claim 1, wherein the fourth inverter comprises a PMOS and NMOS device, with a source of said PMOS device connected to a supply voltage, and a drain of said PMOS device connected to a drain of said NMOS device.

12. The circuit of claim 11, wherein the source of said NMOS device is connected to ground.

13. The circuit of claim 1, wherein said large FET device is a voltage or current activated ESD clamp device, and comprises a Metal-Oxide-Semiconductor Field-Effect Transistor (MOSFET), a Bipolar Junction Transistor (BJT), a Silicon Controlled Rectifier (SCR), or a Diode for Alternating Current (DIAC).

14. The circuit of claim 1, wherein said capacitor comprises a capacitance multiplier circuit, to increase an effective capacitance.

15. The circuit of claim 1, wherein a capacitor is connected between a supply voltage and the gate of said large FET device, to optimize speed.

16. The circuit of claim 1, wherein said first and said second resistance comprise a series combination of passive resistors.

17. The circuit of claim 1, wherein said RC triggered ESD clamp circuit comprises a Schmitt trigger circuit or a series diode device to modify said first, second, and third inverters.

18. The circuit of claim 1, wherein said RC triggered ESD clamp circuit comprises rail strategies such as a central clamp strategy, a distributed clamp strategy, or a boosted rail clamp strategy, as equally effective and advantageous.

19. A method for a compact RC triggered ESD clamp, comprising the steps of:
   providing an RC triggered ESD clamp, using a dynamic feedback trigger signal;
   charging a capacitor with a first resistance and a second resistance at a charging node, wherein said second resistance is higher than said first resistance;
   using said dynamic feedback trigger signal to charge said capacitor with said first resistance when said ESD clamp is off; and
   using said dynamic feedback trigger signal to charge said capacitor with said second resistance when said ESD clamp is on.

20. The method of claim 19, wherein elements connect in such a way that there are no additional active junctions connected to said charging node.

21. The method of claim 19, wherein the supply voltage filters noise when said RC triggered ESD clamp is off.

22. The method of claim 19, wherein said charging node discharges when said RC triggered ESD clamp is on.

23. The method of claim 19, wherein said first resistance provides a first RC time constant of about 30-50 ns.

24. The method of claim 19, wherein said second resistance provides a second RC time constant, longer than said first time constant, of about 500 ns.

25. The method of claim 23, wherein said RC triggered ESD clamp is OFF for said first RC time constant.

26. The method of claim 24, wherein said RC triggered ESD clamp is ON, for said second RC time constant.

* * * * *